US011881768B2

(12) United States Patent
Giovannone et al.

(10) Patent No.: US 11,881,768 B2
(45) Date of Patent: Jan. 23, 2024

(54) METHODS AND APPARATUS FOR ADAPTIVELY CONTROLLING DIRECT CURRENT-DIRECT CURRENT CONVERTER PRECISION

(71) Applicant: STMicroelectronics S.r.l., Agrate Brianza (IT)

(72) Inventors: Juri Giovannone, Cernobbio (IT); Valeria Bottarel, Novara (IT); Stefano Corona, Borgarello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 218 days.

(21) Appl. No.: 17/364,063

(22) Filed: Jun. 30, 2021

(65) Prior Publication Data

US 2023/0006545 A1    Jan. 5, 2023

(51) Int. Cl.
*H03K 5/131* (2014.01)
*H02M 3/04* (2006.01)
*H03K 5/14* (2014.01)
*H03K 5/00* (2006.01)

(52) U.S. Cl.
CPC .............. *H02M 3/04* (2013.01); *H03K 5/131* (2013.01); *H03K 5/14* (2013.01); *H03K 2005/00058* (2013.01)

(58) Field of Classification Search
CPC ........ H02M 1/12; H02M 1/42; H02M 1/4225; H02M 1/4233; H02M 1/4241; H02M 1/4258; H02M 1/425; H02M 1/4208; H02M 1/32; H02M 1/081–084; H02M 2001/4283; H02M 2001/4291; H02M 2003/1552; H02M 3/155–156; H02M 3/145; H02M 3/158; H02M 3/1582–1588; H02M 2001/0012; H02M 2001/0009; H02M 2001/385

See application file for complete search history.

(56) References Cited

U.S. PATENT DOCUMENTS

| 6,087,868 | A | 7/2000 | Millar |
| 6,642,760 | B1 | 11/2003 | Alon et al. |
| 7,202,651 | B2 * | 4/2007 | Chapuis ................ H02M 3/157 323/283 |

(Continued)

OTHER PUBLICATIONS

Batarseh, Majd, "Digital Pulse Width Modulator Techniques for DC-DC Converters," Electronic Theses and Dissertations, STARS, May 2010, 170 pages.

*Primary Examiner* — Bryan R Perez
(74) *Attorney, Agent, or Firm* — Slater Matsil, LLP

(57) ABSTRACT

A direct current (DC) to DC (DC-DC) converter includes a comparator configured to set a pulse width of a signal pulse, the pulse width corresponding to a voltage level of an output voltage of the DC-DC converter; a digital delay line (DDL) operatively coupled to the comparator, the DDL configured increase the pulse width of the signal pulse by linearly introducing delays to the signal pulse; a multiplexer operatively coupled to the DDL, the multiplexer configured to selectively output a delayed version of the signal pulse; and a logic control circuit operatively coupled to the multiplexer and the DDL, the logic control circuit configured to adaptively adjust a precision of the DC-DC converter in accordance with a duty cycle of the DC-DC converter and a setpoint of the DC-DC converter.

20 Claims, 9 Drawing Sheets

(56) References Cited

U.S. PATENT DOCUMENTS

| | | |
|---|---|---|
| 7,236,028 B1 | 6/2007 | Choi |
| 7,656,136 B2 | 2/2010 | Chang |
| 7,710,209 B2 * | 5/2010 | Prodi ........................ H03K 9/02 |
| | | 327/263 |
| 8,330,548 B2 | 12/2012 | Wagner |
| 8,917,128 B1 | 12/2014 | Baek et al. |
| 9,941,889 B1 | 4/2018 | Guo et al. |
| 10,381,915 B1 * | 8/2019 | Dusmez ................ H02M 7/217 |
| 10,474,110 B1 | 11/2019 | Horovitz et al. |
| 11,095,218 B2 | 8/2021 | Kim et al. |
| 2003/0214332 A1 | 11/2003 | Chen et al. |
| 2005/0200342 A1 | 9/2005 | Rudiak |
| 2007/0024331 A1 | 2/2007 | Lin |
| 2007/0126410 A1 | 6/2007 | Figoli |
| 2008/0054958 A1 | 3/2008 | Liu et al. |
| 2009/0206884 A1 | 8/2009 | Shin |
| 2016/0204774 A1 | 7/2016 | Liu |
| 2018/0191356 A1 | 7/2018 | Kesarwani |

\* cited by examiner

METHODS AND APPARATUS FOR ADAPTIVELY CONTROLLING DIRECT CURRENT-DIRECT CURRENT CONVERTER PRECISION

CROSS REFERENCE TO RELATED APPLICATION

This application is related to application Ser. No. 17/364,147, filed concurrently with this application on Jun. 30, 2021, which is incorporated by reference in entirety.

TECHNICAL FIELD

The present invention relates generally to methods and apparatus for adaptively controlling direct current (DC) to DC (DC-DC) converter precision.

BACKGROUND

A direct current (DC) to DC (DC-DC) converter converts a DC input voltage to a DC output voltage. Depending on the operation, the DC-DC converter may produce a relatively constant DC output voltage for any range of DC input voltages.

A digitally controlled DC-DC converter offers a large performance envelope, which may encompass acceptable DC input voltage range, producible DC output voltage range, and stability of the DC output voltage. Therefore, digitally controlled DC-DC converters are good candidates for deployments where flexibility is desired.

SUMMARY

An advantage of the example embodiments is that the precision of a digitally controlled DC-DC converter is adaptively controlled. Furthermore, because the power consumption of the digitally controlled DC-DC converter may be directly related to the precision of the digitally controlled DC-DC converter, the ability to adaptively set the precision can result in a reduction in power consumption when high precision is not required.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

In the ensuing description one or more specific details are illustrated, aimed at providing an understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

A direct current (DC) to DC (DC-DC) converter is used to convert a DC input voltage to a DC output voltage. DC-DC converters may be used in a wide variety of applications, including portable electronic devices (such as cellular telephones, laptop computers, etc.) or automotive applications, for example, where a DC input voltage (from a battery, for example) is converted to a DC output voltage to power circuits. In some applications, multiple DC output voltages are needed for different circuits of a single device. Additionally, some applications have multiple DC input voltages, so the DC-DC converter may need to support operation with different DC input voltages.

Traditional DC-DC converters use analog control circuitry due to the control circuitry's simple implementation and efficiency. However, advancements in digital technology have led to digitally controlled DC-DC converters that offer high-speed operation with low power consumption.

Figure 1:
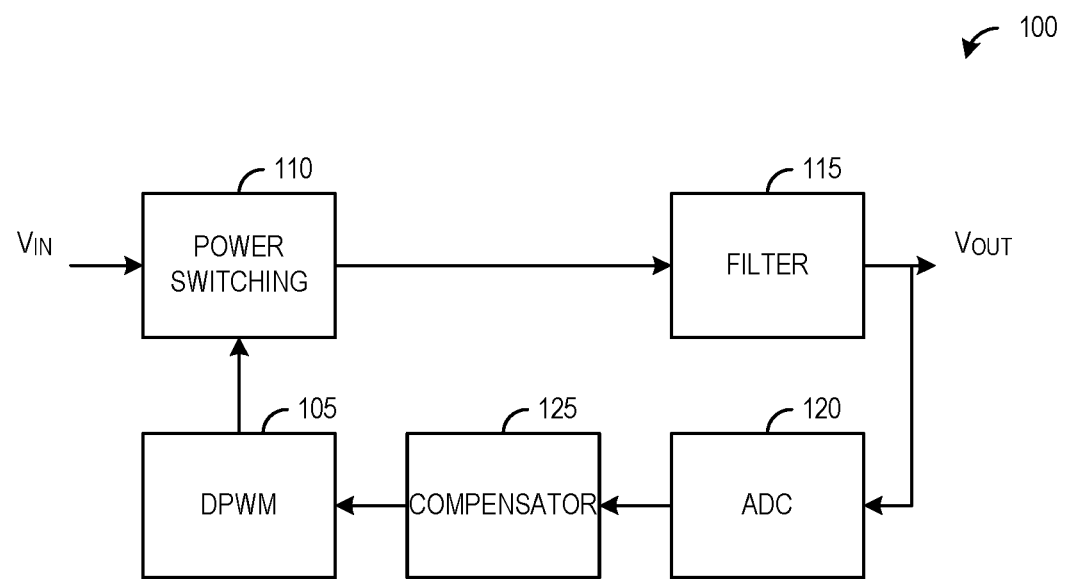
FIG. 1 illustrates a high-level view of a prior art digitally controlled direct current (DC) to DC (DC-DC) converter.

FIG. 1 illustrates a high-level view of a prior art digitally controlled DC-DC converter 100. DC-DC converter 100 includes a digital pulse width modulator (DPWM) 105 that generates a stream of variable width pulses that drives a power stage of DC-DC converter 100 in order to obtain the desired DC output voltage. DPWM 105 changes the pulse widths of the pulses in the stream of variable width pulses to achieve the desired DC output voltage. The stream of variable width pulses is amplified by a power switching circuit no, while a filter 115 averages the amplified stream of variable width pulses to produce the DC output voltage $V_{OUT}$.

An analog to digital converter (ADC) 120 converts a difference (an error) between the DC output voltage $V_{OUT}$ and the desired DC output voltage, and a compensator 125 generates adjustments (e.g., adjustments to the pulse widths) to the stream of variable width pulses to reduce the difference between the DC output voltage $V_{OUT}$ and the desired DC output voltage. Adjustments to the stream of variable width pulses may include changing pulse widths, the duration of the on and off periods of each pulse in the stream of variable width pulses, and so on. As an example, increasing the pulse width of a pulse will increase the DC output voltage $V_{OUT}$, while decreasing the on period of a pulse will decrease the DC output voltage $V_{OUT}$.

Figure 2A:
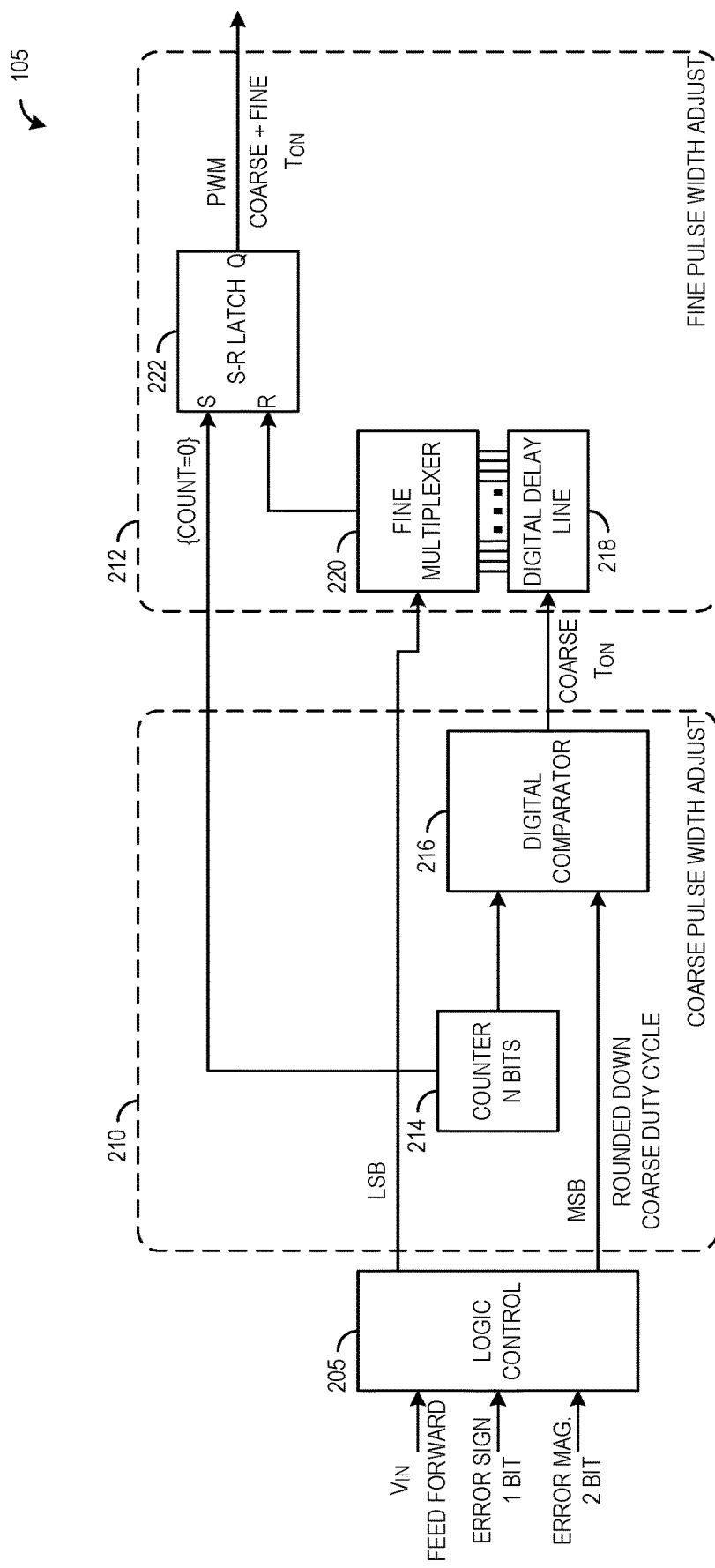
FIG. 2A illustrates a detailed view of a prior art hybrid digital pulse width modulator (DPWM)

FIG. 2A illustrates a detailed view of a prior art DPWM 105. DPWM 105 utilizes a hybrid technique for generating the stream of variable width pulses. DPWM 105 generates a stream of pulses with pulse widths that can adjusted. The discussion presented herein focuses on a single pulse to help prevent confusion. This single pulse will be referred to as a first pulse having a first pulse width. DPWM 105 generates a first pulse width that is generally close to the desired pulse width and then fine tunes the pulse width to more accurately match the desired pulse width. As shown in FIG. 2A, DPWM 105 includes a logic control circuit 205, a coarse pulse width adjust circuit 210, and a fine pulse width adjust circuit 212. Logic control circuit 205 is configured to output a binary value based on the DC input voltage $V_{IN}$, the binary value is also based on an error sign and an error magnitude (both produced by compensator 125, for example). The binary value produced by logic control circuit 205 corresponds to a pulse width of individual pulses of the stream of variable width pulses, which may be based on the DC input voltage $V_{IN}$, as well as error values generated by compensator 125.

Coarse pulse width adjust circuit 210 generates the first pulse width of the pulse, and includes a counter 214 and a digital comparator 216. Counter 214 is configured to increment (or decrement) based on a clock signal of DC-DC converter 100, and comparator 216 compares an output of counter 214 with a specified bit (or bits) of the binary value produced by logic control circuit 205, with the specified bit corresponding to a falling edge of an individual pulse of the stream of variable width pulses. In general, the time between when counter 214 commences counting and the falling edge corresponds to the first pulse width of the pulse. As an example, the specified bit is a most significant bit (MSB) of the binary value produced by logic control circuit 205. Coarse pulse width adjust circuit 210 may operates as follows:

Rising edge of an individual pulse occurs when counter 214 commences, e.g., when counter 214 is reset (to zero, for example). Alternatively, rising edge of an individual pulse may occur based on an output of fine pulse width adjust circuit 212 (e.g., a falling edge of a previous pulse);

Falling edge of an individual pulse occurs when the specified bit (e.g., the MSB) of the output of counter 214 is equal to the specified bit of the output of the binary value produced by logic control circuit 205; and Coarse pulse width adjust circuit 210 operates continually to produce the stream of variable width pulses.

Fine pulse width adjust circuit 212 performs fine tuning on the pulses of the stream of pulses, however, the discussion presented herein focuses on a single pulse of the stream of pulses to help prevent confusion. Fine pulse width adjust circuit 212 performs fine tuning on the first pulse width, and includes a digital delay line (DDL) 218, a multiplexer 220, and a register 222. DDL 218 introduces delays to the rising and falling edges of the individual pulses produced by coarse pulse width adjust circuit 210, allowing fine adjustments to the pulse width of the individual pulses. Fine pulse width adjust circuit 212 can introduce the same delay or different delays to the rising and falling edges of a single pulse. DDL 218 is implemented as a linear sequence of buffers, with each buffer introducing a delay proportional to the propagation delay of the buffer. Multiplexer 220 has multiple inputs with each input coupled to a buffer output of DDL 218. Multiplexer 220 selects a particular delayed rising or falling edge of the individual pulse based on the binary value produced by logic control circuit 205. The selection of multiplexer 220 is based on a least significant bit (LSB) of the binary value generated by logic control circuit 205. Register 222, which is implemented using S-R latches, for example, is set (outputting a high value) when counter 214 is reset and is reset (outputting a low value) when multiplexer 220 outputs a high value (which corresponds to a time that is a sum of the time of the falling edge produced by coarse pulse width adjust circuit 210 and the time delay introduced by DDL 218) resetting register 222. Hence, the pulse width of the individual pulse is a sum of the pulse width of the pulse generated by coarse pulse width adjust circuit 210 (COARSE $T_{ON}$) and delay imparted upon the individual pulse by fine pulse width adjust circuit 212 (FINE $T_{ON}$).

Figure 2B:
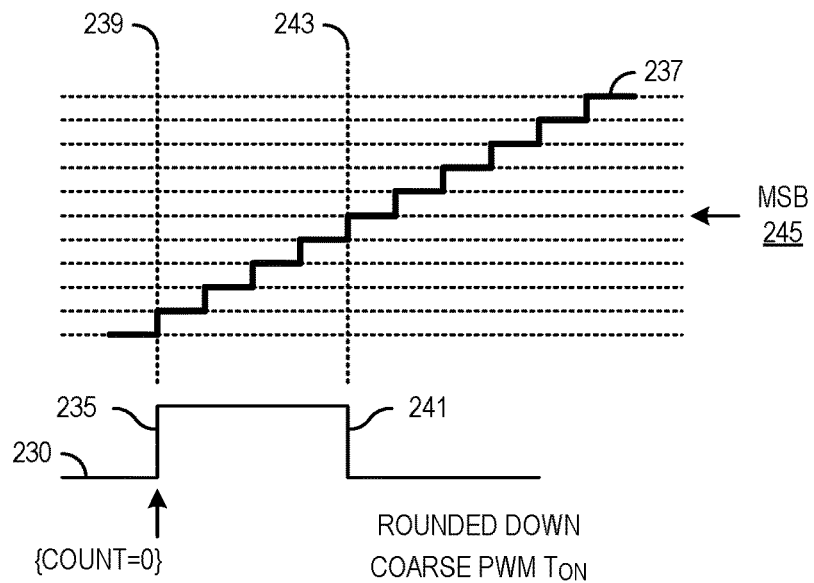
FIG. 2B illustrates a detailed view of a pulse output by coarse pulse width adjust circuit.

FIG. 2B illustrates a detailed view of a pulse 230 output by coarse pulse width adjust circuit 210. Pulse 230 is an individual pulse of the stream of variable pulse pulses. Pulse 230 has a rising edge 235 that corresponds to when counter 214 is reset (trace 237 represents the value of counter 214), which is shown in FIG. 2B as occurring at time 239. Pulse 230 also has a falling edge 241 located at time 243, when the specified bit of counter 214 is equal to the specified bit of the binary value produced by logic control circuit 205. Pulse 230 has a pulse width equal to COARSE $T_{ON}$.

Figure 2C:
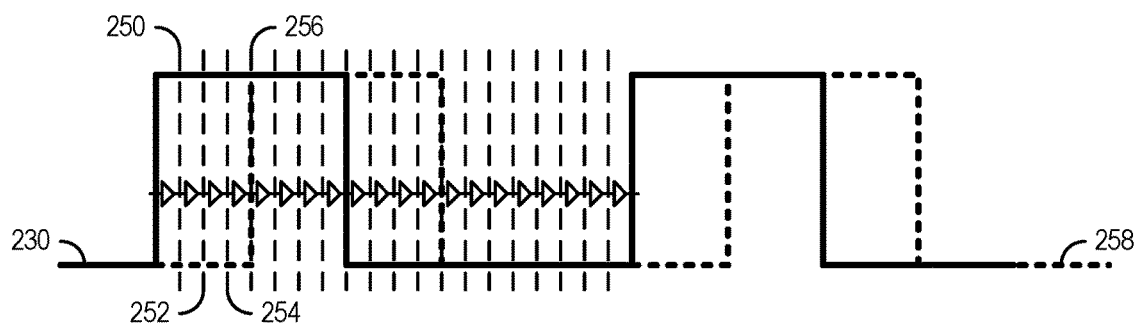
FIG. 2C illustrates a detailed view of pulse delayed by a digital delay line (DDL) 218 of fine pulse width adjust circuit.

FIG. 2C illustrates a detailed view of pulse 230 delayed by DDL 218 of fine pulse width adjust circuit 212. Pulse 230 (output of comparator 218 of coarse pulse width adjust circuit 210) is provided to DDL 218. As discussed previously, DDL 218 comprises a linear sequence of delay elements (e.g., buffers), with each delay element introducing a delay proportional to the propagation delay of the delay element. As shown in FIG. 2C, a time 250 corresponds to a delay introduced by a first delay element of DDL 218, a time 252 corresponds to a delay introduced by a second delay element of DDL 218, a time 254 corresponds to a delay introduced by a third delay element of DDL 218, a time 256 corresponds to a delay introduced by a fourth delay element of DDL 218, and so on. Pulse 258 illustrates pulse 230 delayed by the first four delay elements of DDL 218. The delay introduced by the delay elements is equal to $N*T_{CLK}$=FINE $T_{ON}$, where N is the number of delay elements and $T_{CLK}$ is the switching period of the clock of DC-DC converter 100. Hence, it is possible to increase the pulse width of pulse 230 by utilizing the rising edge of pulse 230 and a falling edge of a delayed pulse (e.g., pulse 258) to produce a pulse with pulse width approximately equal to COARSE $T_{ON}+N^*T_{CLK}$.

An issue that exists with the prior art DC-DC converter 100 is the power consumption associated with the circuitry providing the fine pulse width control, e.g., fine pulse width adjust circuit 212. Individually, each delay element in the linear sequence of delay elements has relatively small power consumption. However, in situations where there may be several hundred delay elements (or more) in the linear sequence of delay elements, the total power consumption may be high. Furthermore, the linear sequence of delay elements is continually consuming power, even in situations where there is no need to adjust the pulse width.

For discussion purposes, consider a situation where the prior art DC-DC converter wo is a buck converter with the following parameters, which are determined from the requirements for the DC-DC converter:

- $f_{SW}$=switching frequency;
- $V_{IN}$=input voltage;
- $V_{OUT}$=output voltage; and
- $\Delta V_{OUT}$=maximum change in the output voltage.

While $f_{CLK}$ (the system clock frequency) directly depends on $$n=V_{IN}/\Delta V_{OUT}.$$

With consideration being given to the fact that $V_{IN}$ may cover a wide range of values, there is a tradeoff between the precision of DC-DC converter wo and the power consumption of DC-DC converter 100, where the precision of DC-DC converter 100 is a measure of how well the output voltage of DC-DC converter wo matches up to the expected output voltage of DC-DC converter 100. In general, the worst operating conditions occur when the input voltage is about equal to the maximum input voltage, where a large $V_{IN}$ implies a large n and a large $f_{CLK}$, which leads to high power consumption (which is needed to guarantee the required precision for every input-output condition). Therefore, ensuring that the input-output conditions are met for large $V_{IN}$ leads to DC-DC converter 100 consuming more power than necessary for all other possible smaller values of $V_{IN}$.

Figure 3:
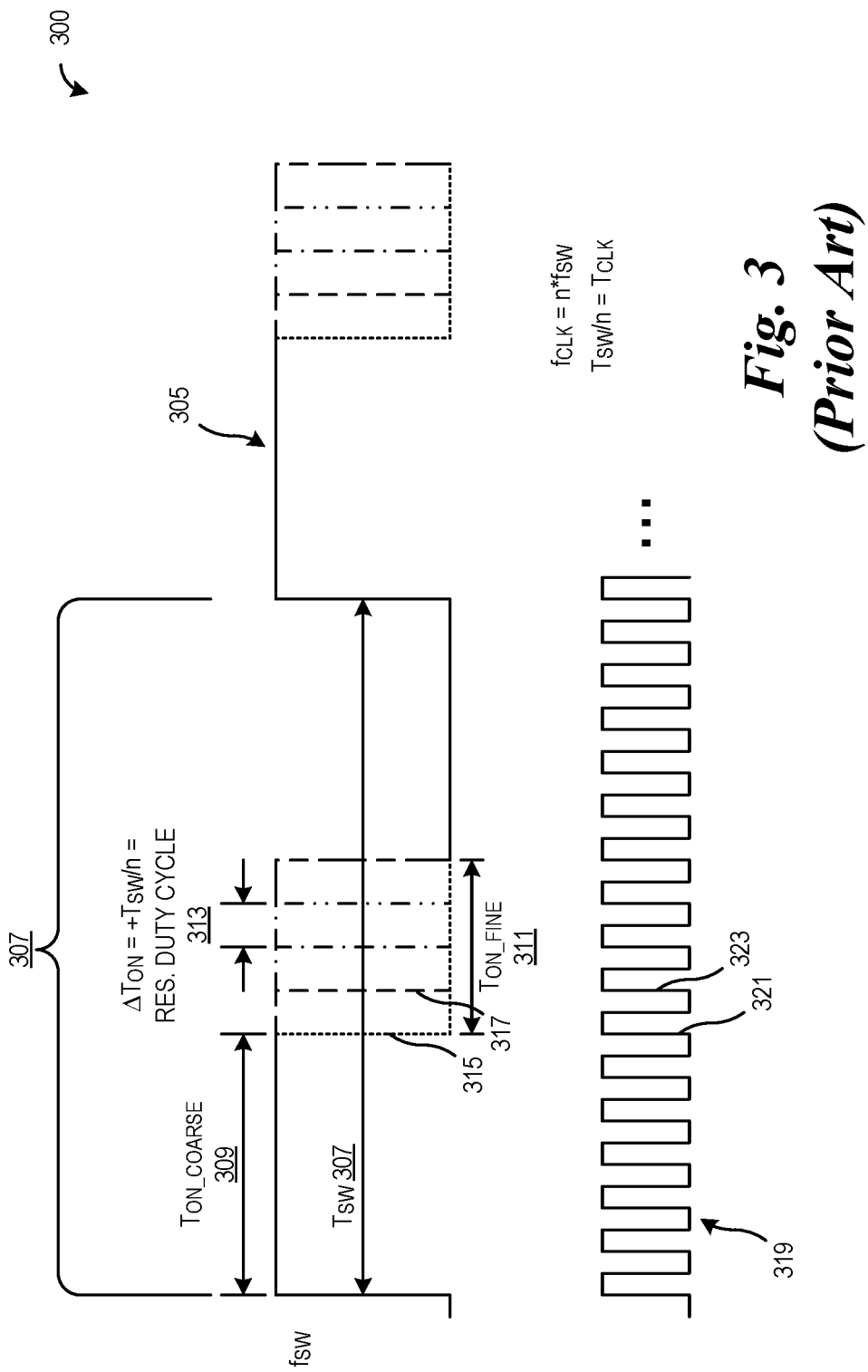
FIG. 3 illustrates a diagram displaying the coarse and fine contributions to $T_{ON}$ of a PWM signal by the prior art hybrid DPWM of FIG. 2A.

FIG. 3 illustrates a diagram 300 displaying the coarse and fine contributions to TON of a PWM signal by DPWM 105. Diagram 300 displays a signal 305 representing the output of register 222 of DPWM 105 of prior art DC-DC converter 100, which is a stream of pulses with pulse widths that is a sum of the output of comparator 216 and multiplexer 220. Signal 305 comprises a plurality of pulses, such as pulse 307. Pulse 307 has a duration $T_{SW}$ (or a frequency of $f_{SW}$), and a pulse width equal to the sum of $T_{ON\_COARSE}$ 309 and $T_{ON\_FINE}$ 311, where $T_{ON\_COARSE}$ 309 is the pulse width generated by comparator 216 and $T_{ON\_FINE}$ 311 is the pulse width generated by multiplexer 220.

As shown in FIG. 3, each delay element of DDL 218 adds a delay equal to $\Delta T_{ON}$ 313 to $T_{ON\_FINE}$ 311. As an example, if DDL 218 is configured to add zero delay to pulse 307, then pulse 307 ends at edge 315, while if DDL 218 is configured to add one delay to pulse 307, then pulse 307 ends at edge 317 (which is $T_{ON\_COARSE}$ 309+1*$\Delta T_{ON}$ 313, and so on. Signal 319 represents the clock of prior art DC-DC converter 100, with $f_{CLK}$=n*$f_{SW}$, and $T_{SW}/n=T_{CLK}$.

$\Delta T_{ON}$ may be expressed as a function of $T_{CLK}$ as $$\Delta T_{ON}=T_{CLK}=T_{SW}/n$$

$$\Delta T_{ON}=T_{CLK}=\Delta\delta^*T_{SW}$$

From which, $\Delta\delta^*T_{SW}=T_{SW}/n$ and $\Delta\delta=1/n$ $\delta=V_{OUT}/V_{IN}$ hence, $\Delta\delta=(\Delta V_{OUT})/V_{IN}$ $1/n=\Delta\delta=(\Delta V_{OUT})/V_{IN}$ $\Delta V_{OUT}=V_{IN}/n$ Therefore, $n=V_{IN}/\Delta V_{OUT}$.

As an illustrative example, consider a deployment of prior art DC-DC converter 100 with a wide range of $V_{IN}$, and $V_{OUT}$=4 volts, and $V_{OUT}$ precision=0.5%. If a high $V_{IN}$ is considered, e.g., $V_{IN}$=40 volts, then $$\delta \pm \Delta\delta = (V_{OUT} \pm \Delta V_{OUT})/V_{IN} = (4 \pm 0.5\%^*4)/40 =$$

$$N^*T_{CLK}/T_{SW} \pm T_{CLK}/T_{SW} = N^*(1/n) \pm 1/n = (4 \pm 0.5\%^*4)/40 =$$

$$(4 \pm 0.2)/40 = 1/10 \pm 0.5/100$$

$$\Delta\delta = \pm 0.5\%^*4/40 = \pm 0.2/40 = \pm 0.5/100 = T_{CLK}/T_{SW}$$

$$f_{CLK} = 200^*f_{SW} ==> n = 200.$$

However, if $V_{IN}$=8 volts, then $$\delta \pm \Delta\delta =$$

$$(V_{OUT} \pm \Delta V_{OUT})/V_{IN} = (4 \pm 0.5\%^*4)/8 = N^*T_{CLK}/T_{SW} \pm T_{CLK}/T_{SW} =$$

$$N^*(1/n) \pm 1/n = (4 \pm 0.5\%^*4)/8 = (4 \pm 0.2)/8 = 1/2 \pm 2.5/100$$

$$\Delta\delta = \pm 0.5\%^*4/8 = \pm 0.2/8 = \pm 2.5/100 = T_{CLK}/T_{SW}$$

$$f_{CLK} = 40^*f_{SW} ==> n = 40.$$

Comparing the two values of n for different input voltages, if the input voltage is large, n is large, while n is smaller for smaller input voltages. The analysis presented above is for buck converters. However, the concept is also applicable to boost converters, as well as other converter topologies.

Figure 4A:
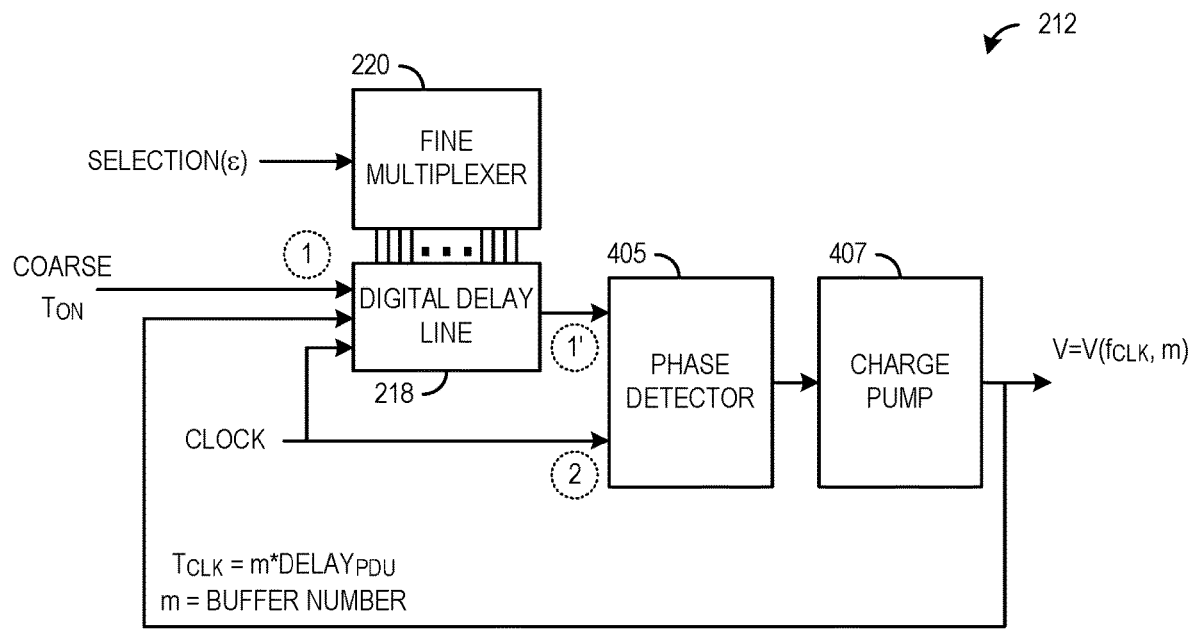
FIG. 4A illustrates a detailed view of a digital delay line (DDL) of a fine pulse width adjust circuit of prior art hybrid DPWM of FIG. 2A.

FIG. 4A illustrates a detailed view of DDL 218 of fine pulse width adjust circuit 212 of prior art DC-DC converter 100. As discussed previously, multiplexer 220 selects a fine tuned delay introduced to a pulse generated by coarse pulse width adjust circuit 210 by a delay element of DDL 218 in accordance with a selection signal. Multiplexer 220 may select a delay as small as zero to as large as the number of delay elements in DDL 218. The output of DDL 218 is provided to a phase detector 405 and a charge pump 407. Phase detector 405 fixes $V_{CTRL}$, which is used to adjust the value of each delay element ($T_{CLK}$=m*$DELAY_{PDU}$). Charge pump 405 converts the phase error into $V_{CTRL}$, which is provided to DDL 218 to adjust the value of each delay element.

Fine pulse width adjust circuit 212 may operate in an open loop configuration with initial calibration as a voltage controlled delay line, where the initial calibration fixes the $V_{CTRL}$ and may be stored in a memory, for example. Fine pulse width adjust circuit 212 may alternatively operate in a closed loop configuration where the $V_{CTRL}$ is continuously adjusted.

Figure 4B:
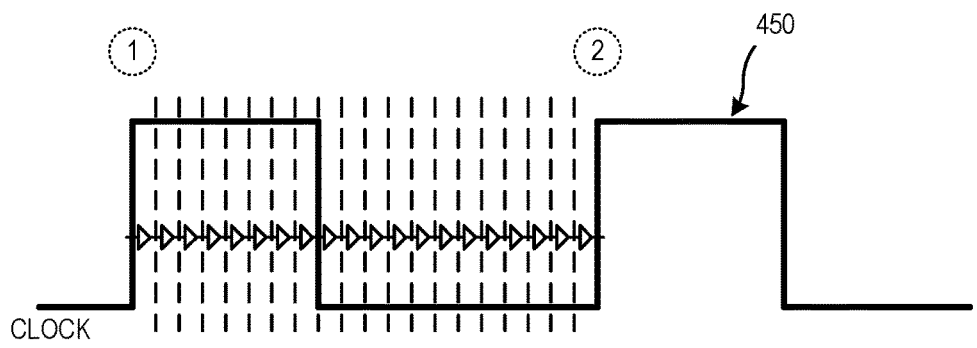
FIG. 4B illustrates a signal displaying a comparison of an input pulse and a delayed version of the input pulse.

FIG. 4B illustrates a signal 450 displaying a comparison of an input pulse and a delayed version of the input pulse. Signal 450 is representative of a signal at input of DDL 218 (at node 1, for example), while dashed vertical lines are representative of delayed versions of the signal, as introduced by the delay elements of DDL 218.

The frequency of the signal $f_{SW}$ and the maximum clock frequency $f_{CLK}$ may also impact the choice of the delay element number m. The determination of m is as follows:

$$\Delta T_{ON} = T_{CLK}/m = T_{SW}/(n*m)$$

$$\Delta T_{ON} = T_{CLK}/m = \Delta\delta * T_{SW}$$

$$\Delta\delta * T_{SW} = T_{SW}/(n*m)$$

$$\Delta\delta = 1/(n*m)$$

$$\delta = V_{OUT}/V_{IN}$$

$$\Delta\delta = (\Delta V_{OUT})/V_{IN}$$

$$1/(n*m) = \Delta\delta = (\Delta V_{OUT})/V_{IN}$$

$$\Delta V_{OUT} = V_{IN}/(n*m)$$

$$(n*m) = V_{IN}/\Delta V_{OUT}$$

$$n = T_{SW}/T_{CLK}.$$

According to an example embodiment, methods and apparatus for adaptively controlling the precision of the DC-DC converter are provided. The precision of the DC-DC converter may be controlled by adaptively controlling the power provided to the fine pulse width tuning circuit of the DC-DC converter, for example. As an example, powering down or eliminating the clock provided to the fine pulse width tuning circuit disables the fine pulse width adjustments to the signals of the stream of pulses output by the DPWM, which results in the reduction of the precision of the DC-DC converter. With the fine pulse width tuning circuit disabled, the pulse width of the signals of the stream of pulses is determined by the coarse pulse width tuning circuit. Additionally, the disabling of the fine pulse width tuning circuit results in elimination of power to the delay elements of the DDL. Hence, the delay elements are no longer consuming current and the power consumption of the DC-DC converter is decreased.

In an embodiment, the precision of the DC-DC converter is adaptively controlled. In other words, the precision of the DC-DC converter is set on an as needed basis. As an example, if the precision of the DC-DC converter is not needed, the fine pulse width tuning circuit is disabled, allowing the DC-DC converter to operate with lower power consumption. As another example, if the precision of the DC-DC converter is needed, the fine pulse width tuning circuit is not disabled, allowing the DC-DC converter to generate the output voltage as required.

In an embodiment, the precision of the DC-DC converter is reduced only in situations where the increased precision is unnecessary. If the precision is needed to produce the desired output voltage, the precision of the DC-DC converter is not changed. In an embodiment, the precision of the DC-DC converter is adaptively set in accordance with the input voltage of the DC-DC converter and a maximum change in the output voltage of the DC-DC converter. As an example, a setpoint of the DC-DC converter is defined as $V_{IN}/\Delta V_{OUT}$, and the precision of the DC-DC converter is adaptively set in accordance with the relationship of the duty cycle (e.g., $V_{OUT}/V_{IN}$) of the DC-DC converter and the setpoint.

As discussed previously, the DC-DC converter operating with high precision is generally required for large values of VIN. Hence, for a fixed VOUT, large values of VIN correspond to small duty cycle values ($\delta = V_{OUT}/V_{IN}$). Therefore, for small duty cycle values, the DC-DC converter may need to operate with high precision. However, for large duty cycle values, the DC-DC converter may not need to operate with high precision, with an added benefit of reduced power consumption.

As an example, if the duty cycle is less than the setpoint, the precision of the DC-DC converter is left unchanged. As another example, if the duty cycle is greater than the setpoint, the precision of the DC-DC converter is reduced. The precision of the DC-DC converter may be reduced by powering down or eliminating the clock to the fine pulse width tuning circuit of the DC-DC converter.

In an embodiment, a logic control circuit includes logic to assert a first value on a DDL enable line when the precision of the DC-DC converter is left unchanged. As an example, if the duty cycle is less than the setpoint, the logic control circuit asserts the first value (e.g., a logic true) on the DDL enable line.

In an embodiment, the logic control circuit includes logic to assert a second value on the DDL enable line when the precision of the DC-DC converter is reduced. As an example, if the duty cycle is greater than the setpoint, the logic control circuit asserts the second value (e.g., a logic false) on the DDL enable line.

In an embodiment, in addition to adaptively enable or disable the DDL, a source of the pulse width of the pulses of the stream of pulses is also selected adaptively. As discussed previously, the pulse width of the pulses of the stream of pulses may be specified by the output of comparator 216 (the output of coarse pulse width adjust circuit 210) or multiplexer 220 (the output of fine pulse width adjust circuit 212). However, with the DLL potentially being disabled, the output of multiplexer 220 may be undefined or unknown. In such situations, the output of multiplexer 220 should be disabled.

In an embodiment, the logic control circuit includes logic to assert a first value on a fine adjust select line when the precision of the DC-DC converter is left unchanged, where the fine adjust select line is used to select either the output of the coarse pulse width adjust circuit or the fine pulse width adjust circuit. In other words, fine adjust select line enables or disables the output of the fine pulse width adjust circuit (i.e., the delayed pulses generated by DDL 218) based on the logic value asserted thereon. As an example, if the duty cycle is less than the setpoint, the logic control circuit asserts the first value (e.g., a logic true) on the fine adjust select line, resulting in the selection of the output of fine pulse width adjust circuit 212. As an example, if the duty cycle is greater than the setpoint, the logic control circuit asserts the second value (e.g., a logic false) on the fine adjust select line, resulting in the selection of the output of coarse pulse width adjust circuit 210.

Figure 5:
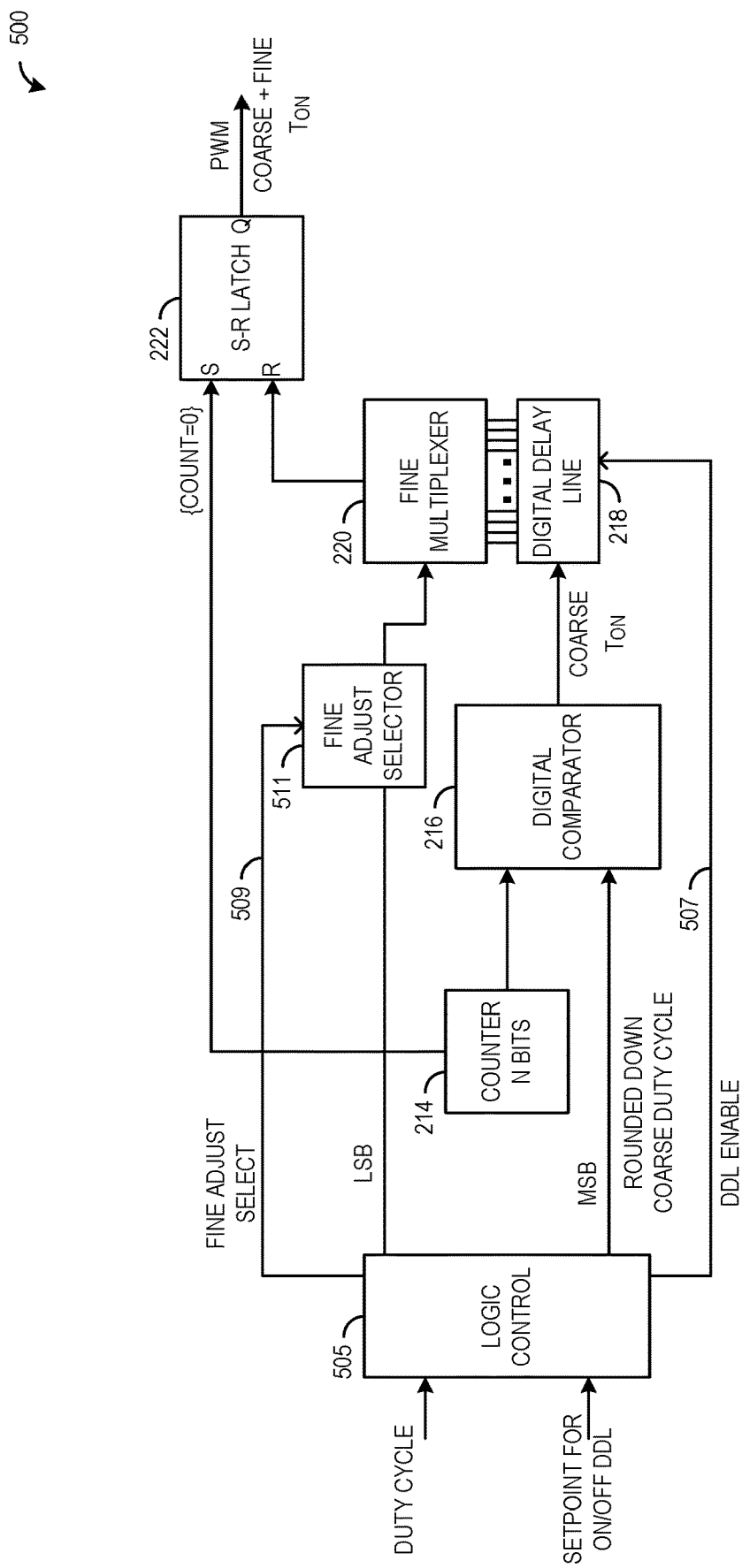
FIG. 5 illustrates a detailed view of a DPWM with logic and circuitry to adaptively control the precision of a DC-DC converter according to an embodiment.

FIG. 5 illustrates a detailed view of a DPWM 500 with logic and circuitry to adaptively control the precision of a DC-DC converter. DPWM 500 includes logic and circuitry to adaptively control the precision of a DC-DC converter that controls the pulse widths of the pulses in the stream of pulses. As an example, DPWM 500 may be a replacement for DPWM 105 of prior art DC-DC converter 100 to provide adaptive control of the precision of prior art DC-DC converter 100.

DPWM 500 includes counter 214, comparator 216, DDL 218, multiplexer 220, and register 222, which may be implemented in a similar manner or operate in a similar way to the description of DPWM 105, provided previously.

DPWM 500 includes a logic control circuit 505 is configured to assert values on a DDL enable line 507 and a fine adjust select line 509 in accordance with inputs, which include the duty cycle (e.g., $\delta = V_{OUT}/V_{IN}$) of the DC-DC converter and the setpoint (e.g., $n = V_{IN}/\Delta V_{OUT}$) of the DC-DC converter. As an example, logic control circuit 505 compares the duty cycle with the setpoint, and if the duty cycle is less than the setpoint, logic control circuit 505 asserts a logic true value on DDL enable line 507 and a logic true value on fine adjust select line 509 to operate the DC-DC converter with the high precision afforded by the fine pulse width adjust circuit. The setpoint may depend upon the process technology of DPWM 500, the frequency of the system clock, etc. The setpoint may be determined using circuit simulation, for example. As an example, circuit simulation may be performed for a range of different system clock frequencies, process technologies, and so on, to find setpoints, and the setpoints are stored in memory for subsequent use. Example values of the setpoint include values within a range from about 0.5 to 0.7, however, other values of the setpoint may be possible.

As another example, if the duty cycle is greater than the setpoint, logic control circuit 505 asserts a logic false value on DDL enable line 507 and a logic false value on fine adjust select line 509 to operate the DC-DC converter without the high precision afforded by the fine pulse width adjust circuit but with reduced power consumption. An alternate mapping of the logic values is also possible. For example, logic false values are asserted on DDL enable line 507 and fine adjust select line 511 when the duty cycle is less than the setpoint, while logic true values are asserted on DDL enable line 507 and fine adjust select line 511 when the duty cycle is greater than the setpoint As another example, if the duty cycle is less than or equal to the setpoint, logic control circuit 505 asserts a logic true value on DDL enable line 507 and a logic true value on fine adjust select line 509 to operate the DC-DC converter with the high precision afforded by the fine pulse width adjust circuit. An alternate mapping of the logic values is also possible.

As another example, if the duty cycle is greater than or equal to the setpoint, logic control circuit 505 asserts a logic false value on DDL enable line 507 and a logic false value on fine adjust select line 509 to operate the DC-DC converter without the high precision afforded by the fine pulse width adjust circuit but with reduced power consumption. An alternate mapping of the logic values is also possible.

DDL enable line 507 is coupled to DDL 218 and enables or disables DDL 218 in accordance with the logic value asserted thereon. As an example, when a logic true value is asserted on DDL enable line 507, power is provided to the delay elements of DDL 218 or a clock is provided to the delay elements of DDL 218. As another example, when a logic false value is asserted on DDL enable line 507, power is removed from the delay elements of DDL 218 or a clock is removed from the delay elements of DDL 218.

Fine adjust select line 509 is coupled to a fine adjust selector 511, which is also coupled to a LSB of a binary value generated by logic control circuit 505 that is used to generate the pulses of the stream of pulses. Fine adjust selector 511 selectively outputs the LSB of the binary value generated by logic control circuit 505 in accordance with the logic value asserted on fine adjust select line 509. The output of fine adjust selector 511 may be used as a select line for multiplexer 220, selectively selecting a delayed edge generated by comparator 216 or an undelayed edge as output by comparator 216. As an example, when a logic true value is asserted on fine adjust select line 509, fine adjust selector 511 does not output the LSB of the binary value, while if a logic false value is asserted on fine adjust select line 509, fine adjust selector 511 outputs the binary zero value.

Figure 6A:
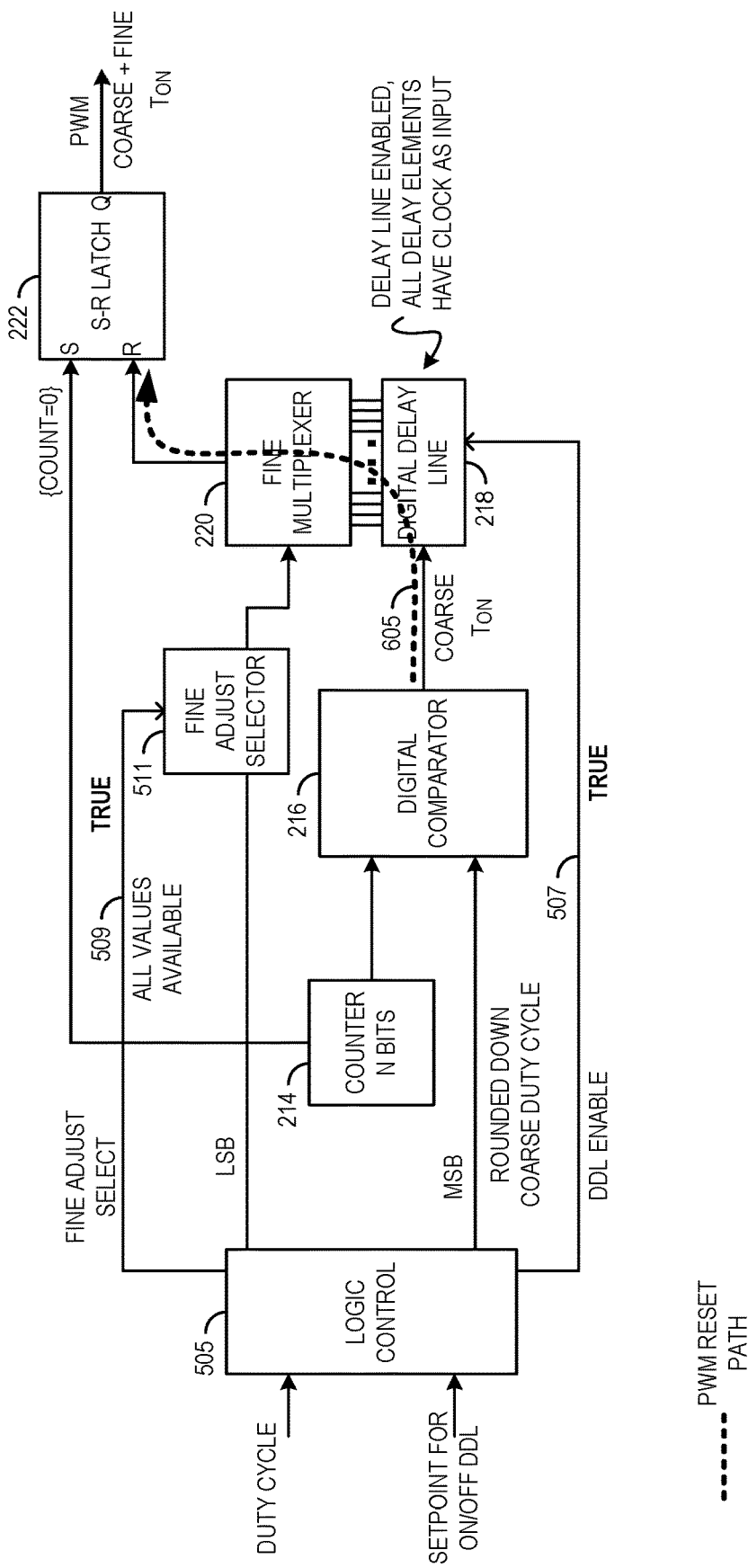
FIG. 6A illustrates a detailed view of an example DPWM with logic and circuitry to adaptively control the precision of a DC-DC converter, highlighting the adaptive control of the DC-DC converter operating with full precision according to an embodiment.

FIG. 6A illustrates a detailed view of DPWM 500 with logic and circuitry to adaptively control the precision of a DC-DC converter, highlighting the adaptive control of the DC-DC converter operating with full precision.

As discussed previously, the DC-DC converter operates with full precision when the duty cycle of the DC-DC converter is less than the setpoint of the DC-DC converter. Logic control circuit 505 may compare the duty cycle with the setpoint, and if the duty cycle is less than the setpoint, assert logic true values on DDL enable line 507 and fine adjust select line 509. Although the discussion focusses on the situation where the logic true value corresponds to the situation where the duty cycle is less than the setpoint, other logical value mappings are possible.

With DDL enable line 507 set to the logic true value, DDL 218 is enabled. As discussed previously, being enabled means that the delay elements of DDL 218 may be powered or a clock signal is applied to the delay elements of DDL 218, or both. With DDL 218 being enabled, the output of comparator 216 is delayed by the various delay elements of DDL 218. At least some of the delayed outputs of comparator 216 are provided to multiplexer 220.

With fine adjust select line 509 set to the logic true value, fine adjust selector 511 is set to select one of the inputs of multiplexer 220 (i.e., the delayed outputs of comparator 216) to provide to register 222. A dashed line 605 represents a signal path of the output of comparator 216 to register 222. Because the output of comparator 216 is delayed by the delay elements of DDL 218, the pulse width of the stream of pulses may be precisely tuned to achieve the specified $V_{OUT}$.

Figure 6B:
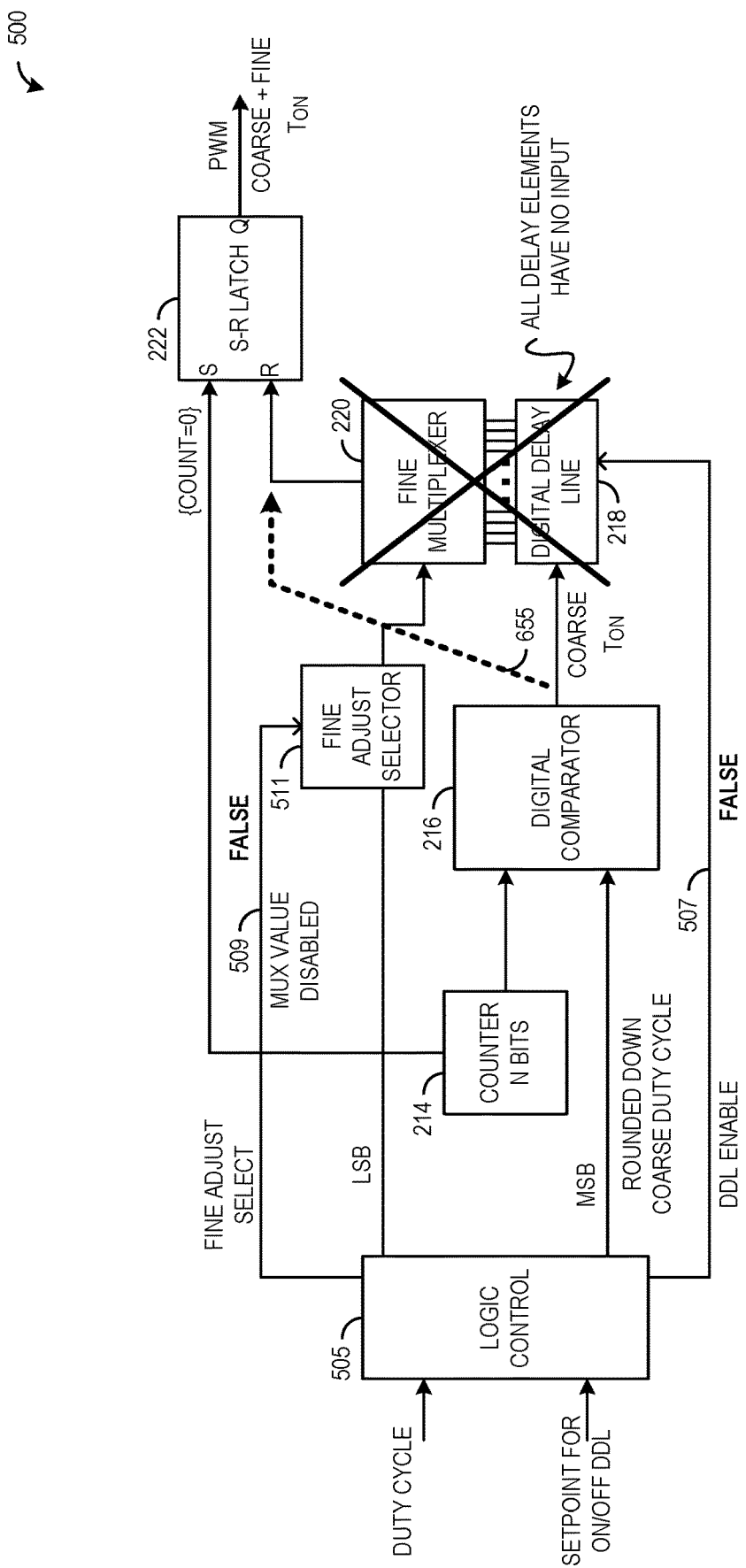
FIG. 6B illustrates a detailed view of DPWM with logic and circuitry to adaptively control the precision of a DC-DC converter, highlighting the adaptive control of the DC-DC converter operating without full precision according to an embodiment.

FIG. 6B illustrates a detailed view of DPWM 500 with logic and circuitry to adaptively control the precision of a DC-DC converter, highlighting the adaptive control of the DC-DC converter operating without full precision.

As discussed previously, the DC-DC converter operates without full precision when the duty cycle of the DC-DC converter is greater than the setpoint of the DC-DC converter. Logic control circuit 505 may compare the duty cycle with the setpoint, and if the duty cycle is greater than the setpoint, assert logic false values on DDL enable line 507 and fine adjust select line 509. Although the discussion focusses on the situation where the logic false value corresponds to the situation where the duty cycle is greater than the setpoint, other logical value mappings are possible.

With DDL enable line 507 set to the logic false value, DDL 218 is disabled. As discussed previously, being disabled means that the delay elements of DDL 218 may be unpowered or a clock signal is not applied to the delay elements of DDL 218, or both. With DDL 218 being disabled, the output of comparator 216 is not delayed by the various delay elements of DDL 218. Hence, there are no delayed outputs of comparator 216 to be provided to multiplexer 220.

With fine adjust select line 509 set to the logic false value, fine adjust selector 511 is set to select none of the inputs of multiplexer 220 (i.e., the delayed outputs of comparator 216) to provide to register 222. Instead, multiplexer 220 is bypassed and the output of comparator 216 is coupled to register 222. A dashed line 655 represents a signal path of the output of comparator 216 to register 222. Due to the relationship between the duty cycle and the setpoint, precise control of $T_{ON}$ is not necessary to obtain the desired $V_{OUT}$. Hence, the output of comparator 216 bypasses DDL 218 and the precise control of $T_{ON}$ is skipped.

Figure 7:
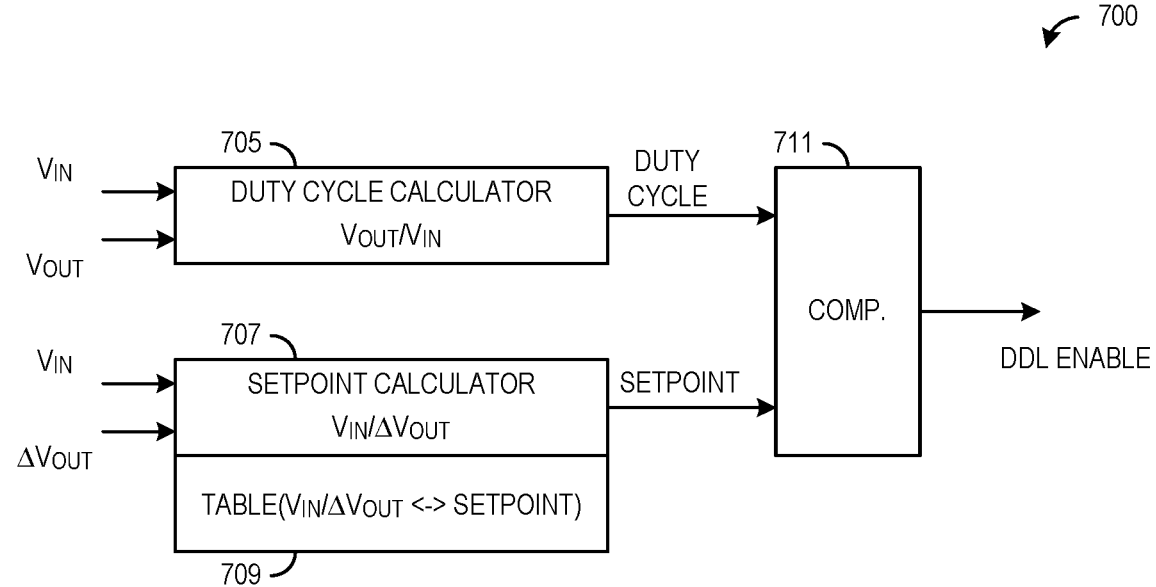
FIG. 7 illustrates a circuit generating the DDL enable signal asserted on DDL enable line according to an embodiment.

FIG. 7 illustrates a circuit 700 generating the DDL enable signal asserted on DDL enable line 507. Circuit 700 may be a part of DPWM 500 of FIG. 5, for example. Circuit 700 includes a duty cycle calculator 705 configured to determine the duty cycle of the DC-DC converter. Duty cycle calculator 705 has, as inputs, the expected $V_{IN}$ and the expected $V_{OUT}$ for the DC-DC converter. The expected $V_{IN}$ may be an actual measurement of the input voltage or a maximum specified input voltage, while the expected $V_{OUT}$ may be a specified voltage. As an example, duty cycle calculator 705 determines the duty cycle as $V_{OUT}/V_{IN}$.

Circuit 700 also includes a setpoint calculator 707 configured to determine the setpoint of the DC-DC converter. Setpoint calculator 707 has, as inputs, the expected VIN and the maximum range of $V_{OUT}$ for the DC-DC converter. The expected $V_{IN}$ may be an actual measurement of the input voltage or a maximum specified input voltage, while the maximum range of $V_{OUT}$ may be a specified value. Setpoint calculator 707 determines the setpoint in accordance with the expected $V_{IN}$ and $\Delta V_{OUT}$. As an example, setpoint calculator 707 determines the setpoint as $V_{IN}/\Delta V_{OUT}$. In an embodiment, the setpoints for a range of $V_{IN}/\Delta V_{OUT}$ values are predetermined and stored in a memory. The range of $V_{IN}/\Delta V_{OUT}$ values are arranged in a table stored in the memory, for example. The table may be indexed by $V_{IN}/\Delta V_{OUT}$, for example. Then, setpoint calculator 707 may retrieve the setpoint corresponding to a particular $V_{IN}/\Delta V_{OUT}$. In an embodiment, setpoint calculator 707 retrieves the setpoint associated with a $V_{IN}/\Delta V_{OUT}$ that is closest to the particular $V_{IN}/\Delta V_{OUT}$.

The duty cycle and the setpoint are provided to a comparator 711 that compares the two values and asserts a value based on the comparison. Comparator 711 may be a part of logic control circuit 505, for example.

The value of fine adjust select line 509 may be generated in a similar fashion. In an embodiment, the logical values of fine adjust select line 509 and DDL enable line 507 are equal.

Figure 8:
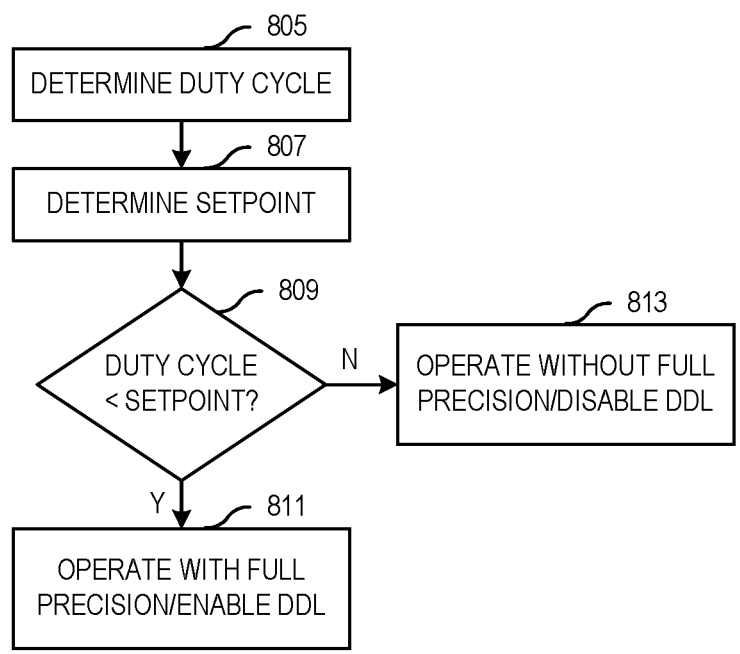
FIG. 8 illustrates a flow diagram of example operations occurring in the DC-DC converter according to an embodiment.

FIG. 8 illustrates a flow diagram of example operations 800 occurring in the DC-DC converter. Operations 800 may be indicative of operations occurring in the DC-DC converter as the DC-DC converter adaptively controls the precision of the DC-DC converter. As an example, operations 800 occur within the DPWM of the DC-DC converter.

Operations 800 begin with the DC-DC converter determining the duty cycle of the DC-DC converter (block 805). The duty cycle of the DC-DC converter may be based on the input voltage $V_{IN}$ of the DC-DC converter and the output voltage $V_{OUT}$ of the DC-DC converter. The input voltage is the expected input voltage or the maximum permitted input voltage, for example. Similarly, the output voltage is the expected output voltage, for example. As an example, the duty cycle of the DC-DC converter is expressible as $V_{OUT}/V_{IN}$. The DC-DC converter determines the setpoint (block 807). The setpoint of the DC-DC converter may be based on the input voltage $V_{IN}$ and the maximum range of the output voltage $\Delta V_{OUT}$. The input voltage is the expected input voltage or the maximum permitted input voltage, for example. Similarly, the maximum range of the output voltage is the maximum expected range of the output voltage, for example. As an example, the setpoint of the DC-DC converter is expressible as $V_{IN}/\Delta V_{OUT}$. In an embodiment, the setpoint of the DC-DC converter is determined a priori and stored in a memory. Then, the DC-DC converter can readily retrieve the setpoint corresponding to a particular $V_{IN}/\Delta V_{OUT}$ value from the memory, instead of having to compute the division in real-time.

The DC-DC converter performs a check to determine if the duty cycle is less than the setpoint (block 809). The check if the duty cycle is less than the setpoint is a check to determine if the precision of the DC-DC converter should be adaptively controlled. As an example, if the duty cycle is less than the setpoint, then the DC-DC converter should operate with full precision to enable the DC-DC converter to generate the expected output voltage, while if the duty cycle is greater than the setpoint, then the DC-DC converter should operate without full precision because the DC-DC converter is able to generate the expected output voltage without the operation of the fine pulse width adjust circuit. In an alternate embodiment, the DC-DC converter checks if the duty cycle is less than or greater than the setpoint to determine if the precision of the DC-DC converter should be adaptively controlled.

If the duty cycle is less than the setpoint, then the DC-DC converter operates with full precision and the DC-DC converter enables the DDL (block 811). As discussed previously, operating with full precision involves generating a pulse with a pulse width that is a sum of the coarse $T_{ON}$ and the fine $T_{ON}$, where the fine $T_{ON}$ is proportional to the delay introduced by the DDL. Operating with full precision may involve the DC-DC converter asserting logic true values on the DDL enable line and the fine adjust select line, for example. Operating with full precision includes the DC-DC converter generating the pulses of the stream of pulses.

If the duty cycle is greater than the setpoint, then the DC-DC converter operates without full precision and the DC-DC converter disables the DDL (block 813). As discussed previously, operating without full precision involves generating a pulse with a pulse width that is based on the coarse $T_{ON}$. Operating without full precision may involve the DC-DC converter asserting logic false values on the DDL enable line and the fine adjust select line, for example. Operating without full precision includes the DC-DC converter generating the pulses of the stream of pulses.

In general, the DC-DC converter continues generating the pulses of the stream of pulses until the input voltage changes, the output voltage changes, or both the input and output voltages change. In such a situation, it may be necessary for the DC-DC converter to repeat operations 800 to potentially adapt the precision of the DC-DC converter should the duty cycle, the setpoint, or both the duty cycle and the setpoint change.

For illustrative purposes, consider an example DC-DC converter operating with a 50 MHz system clock and a DDL with 128 delay elements. Using a commonly available 180 nm process technology, each delay element may consume about 6.03 uA each. Therefore, the entire DDL will consume 6.03 uA*128~772 uA. Hence, if the full precision of the DC-DC converter is not required, operating without the DDL would save approximately 772 uA. Additional power reduction may be achieved if the charge pump (e.g., charge pump 407) is also switched off.

Example embodiments of the invention are summarized here. Other embodiments can also be understood from the entirety of the specification as well as the claims filed herein. Reference numerals are added below for illustration purposes only and the various examples could be implemented differently and are not to be construed as being limited to only these illustrations.

Example 1. A direct current (DC) to DC (DC-DC) converter including: a comparator (216) configured to set a pulse width of a signal pulse (230, 305, 450), the pulse width corresponding to a voltage level of an output voltage of the DC-DC converter; a digital delay line (DDL) (218) operatively coupled to the comparator, the DDL configured to increase the pulse width of the signal pulse by linearly introducing delays to the signal pulse; a multiplexer (220) operatively coupled to the DDL, the multiplexer configured to selectively output a delayed version of the signal pulse; and a logic control circuit (205, 700 operatively coupled to the multiplexer and the DDL, the logic control circuit configured to adaptively adjust a precision of the DC-DC converter in accordance with a duty cycle of the DC-DC converter and a setpoint of the DC-DC converter.

Example 2. The DC-DC converter of example 1, further including a fine adjust selector operatively coupled between the logic control circuit and the multiplexer, the fine adjust selector configured to select one of the pulse width of the signal pulse or the delayed version of the signal pulse in accordance with the duty cycle of the DC-DC converter and the setpoint of the DC-DC converter.

Example 3. The DC-DC converter of one of examples 1 or 2, where the duty cycle of the DC-DC converter is a ratio of the output voltage of the DC-DC converter to an input voltage of the DC-DC converter.

Example 4. The DC-DC converter of one of examples 1 to 3, where the setpoint of the DC-DC converter is a ratio of an input voltage of the DC-DC converter to a maximum range in the output voltage of the DC-DC converter.

Example 5. The DC-DC converter of one of examples 1 to 4, where the logic control circuit is configured to generate a delay line enable signal and a fine adjust enable signal, based on the delay line enable signal, the logic control circuit is configured to disable the DDL in accordance with the duty cycle of the DC-DC converter and the setpoint of the DC-DC converter, and based on the fine adjust select signal, the logic control circuit is configured to select the pulse width of the signal pulse in accordance with the duty cycle of the DC-DC converter and the setpoint of the DC-DC converter.

Example 6. The DC-DC converter of one of examples 1 to 5, where the logic control circuit is configured to assert a first value on the delay line enable signal to enable the DDL when the duty cycle of the DC-DC converter is less than the setpoint of the DC-DC converter, and where the logic control circuit is configured to assert a second value on the delay line enable signal to disable the DDL when the duty cycle of the DC-DC converter is greater than the setpoint of the DC-DC converter.

Example 7. The DC-DC converter of one of examples 1 to 6, where enabling the DDL includes providing a clock signal to the DDL, and disabling the DDL includes not providing the clock signal to the DDL.

Example 8. The DC-DC converter of one of examples 1 to 7, where the logic control circuit is configured to assert a first value on the fine adjust select signal to select the delayed version of the signal pulse when the duty cycle of the DC-DC converter is less than the setpoint of the DC-DC converter, and where the logic control circuit is configured to assert a second value on the fine adjust select signal to select the pulse width of the signal pulse when the duty cycle of the DC-DC converter is greater than the setpoint of the DC-DC converter.

Example 9. The DC-DC converter of one of examples 1 to 8, where the comparator is operatively coupled to a counter and the logic control circuit, the comparator configured to set the pulse width of the signal pulse in accordance with an output of the counter and a most significant bit signal output of the logic control circuit.

Example 10. The DC-DC converter of one of examples 1 to 9, where the DDL including a linear sequence of delay elements, and where inputs of the multiplexer are coupled to outputs of delay elements of the linear sequence of delay elements.

Example 11. A method for operating a direct current (DC) to DC (DC-DC) converter, the method including: determining, by the DC-DC converter, a setpoint of the DC-DC converter; determining, by the DC-DC converter, a first duty cycle of the DC-DC converter; and determining, by the DC-DC converter, that the first duty cycle is greater than the setpoint, and based thereon, generating, by the DC-DC converter, a first signal pulse having a first pulse width in accordance with an input voltage and an output voltage of the DC-DC converter, the signal pulse corresponding to a voltage level of the output voltage of the DC-DC converter; powering down, by the DC-DC converter, a digital delay line (DDL) used to introduce delays to the first pulse width of the first signal pulse; and outputting, by the DC-DC converter, the first signal pulse.

Example 12. The method of example 11, the first duty cycle of the DC-DC converter being a ratio of an output voltage of the DC-DC converter to an input voltage of the DC-DC converter.

Example 13. The method of one of examples 11 or 12, the first duty cycle of the DC-DC converter being expressible as: duty cycle=VOUT/VIN, where VOUT is a voltage level of the output voltage of the DC-DC converter, and VIN is a voltage level of the input voltage of the DC-DC converter.

Example 14. The method of one of examples 11 to 13, the setpoint of the DC-DC converter being a ratio of an input voltage of the DC-DC converter to a maximum variance in an output voltage of the DC-DC converter.

Example 15. The method of one of examples 11 to 14, further including: determining, by the DC-DC converter, a second duty cycle of the DC-DC converter; and determining, by the DC-DC converter, that the second duty cycle is less than the setpoint, and based thereon, generating, by the DC-DC converter, a second signal pulse having a second pulse width in accordance with the input voltage and the output voltage of the DC-DC converter, the second signal pulse corresponding to a voltage level of the output voltage of the DC-DC converter; providing, by the DC-DC converter, power to the DDL used to introduce delays to the second pulse width of the second signal pulse; and outputting, by the DC-DC converter, a delayed version of the second signal pulse.

Example 16. A direct current (DC) to DC (DC-DC) converter including: a comparator configured to set a pulse width of a signal pulse, the pulse width corresponding to a voltage level of an output voltage of the DC-DC converter; a digital delay line (DDL) operatively coupled to the comparator, the DDL configured to linearly introduce delays to the signal pulse, thereby increasing the pulse width of the signal pulse; a multiplexer operatively coupled to the DDL, the multiplexer configured to selectively output a delayed version of the signal pulse; one or more processors; and a non-transitory memory storage including instructions that, when executed by the one or more processors, cause the DC-DC converter to: determine a setpoint of the DC-DC converter; determine a first duty cycle of the DC-DC converter; and determine that the first duty cycle is greater than the setpoint, and based thereon, generate a first signal pulse having a first pulse width in accordance with an input voltage and an output voltage of the DC-DC converter, the first signal pulse corresponding to a voltage level of the output voltage of the DC-DC converter; power down a digital delay line (DDL) used to introduce delays to the first pulse width of the first signal pulse corresponding to a voltage level of the output voltage of the DC-DC converter; and output the first signal pulse.

Example 17. The DC-DC converter of example 16, where the first duty cycle of the DC-DC converter is a ratio of the output voltage of the DC-DC converter to an input voltage of the DC-DC converter.

Example 18. The DC-DC converter of one of examples 16 or 17, the first duty cycle of the DC-DC converter being expressible as: duty cycle=VOUT/VIN, where VOUT is a voltage level of the output voltage of the DC-DC converter, and VIN is a voltage level of the input voltage of the DC-DC converter.

Example 19. The DC-DC converter of one of examples 16 to 18, where the setpoint of the DC-DC converter is a ratio of the input voltage of the DC-DC converter to a maximum variance in the output voltage of the DC-DC converter.

Example 20. The DC-DC converter of one of examples 16 to 19, the instructions cause the DC-DC converter to determine a second duty cycle of the DC-DC converter; and determine that the second duty cycle is less than the setpoint, and based thereon, generate a second signal pulse having a second pulse width in accordance with the input voltage and the output voltage of the DC-DC converter, the second signal pulse corresponding to a voltage level of the output voltage of the DC-DC converter; provide power to the DDL used to introduce delays to the second pulse width of the second signal pulse; and output a delayed version of the second signal pulse.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A direct current (DC) to DC (DC-DC) converter comprising:
    a comparator configured to set a pulse width of a signal pulse, the pulse width corresponding to a voltage level of an output voltage of the DC-DC converter;
    a digital delay line (DDL) operatively coupled to the comparator, the DDL configured to increase the pulse width of the signal pulse by linearly introducing delays to the signal pulse;
    a multiplexer operatively coupled to the DDL, the multiplexer configured to selectively output a delayed version of the signal pulse; and
    a logic control circuit operatively coupled to the multiplexer and the DDL, the logic control circuit configured to adaptively adjust a precision of the DC-DC converter in accordance with a duty cycle of the DC-DC converter and a setpoint of the DC-DC converter, and configured to disable the DDL in accordance with the duty cycle of the DC-DC converter and the setpoint of the DC-DC converter.

2. The DC-DC converter of claim 1, further comprising a fine adjust selector operatively coupled between the logic control circuit and the multiplexer, the fine adjust selector configured to select one of the pulse width of the signal pulse or the delayed version of the signal pulse in accordance with the duty cycle of the DC-DC converter and the setpoint of the DC-DC converter.

3. The DC-DC converter of claim 1, wherein the duty cycle of the DC-DC converter is a ratio of the output voltage of the DC-DC converter to an input voltage of the DC-DC converter.

4. The DC-DC converter of claim 1, wherein the setpoint of the DC-DC converter is a ratio of an input voltage of the DC-DC converter to a maximum range in the output voltage of the DC-DC converter.

5. The DC-DC converter of claim 1, wherein the comparator is operatively coupled to a counter and the logic control circuit, the comparator configured to set the pulse width of the signal pulse in accordance with an output of the counter and a most significant bit signal output of the logic control circuit.

6. The DC-DC converter of claim 1, wherein the DDL comprising a linear sequence of delay elements, and wherein inputs of the multiplexer are coupled to outputs of delay elements of the linear sequence of delay elements.

7. The DC-DC converter of claim 1, wherein:
    the logic control circuit is configured to generate a delay line enable signal and a fine adjust enable signal,
    based on the delay line enable signal, the logic control circuit is configured to disable the DDL in accordance with the duty cycle of the DC-DC converter and the setpoint of the DC-DC converter, and
    based on the fine adjust select signal, the logic control circuit is configured to select the pulse width of the signal pulse in accordance with the duty cycle of the DC-DC converter and the setpoint of the DC-DC converter.

8. The DC-DC converter of claim 7, wherein the logic control circuit is configured to assert a first value on the delay line enable signal to enable the DDL when the duty cycle of the DC-DC converter is less than the setpoint of the DC-DC converter, and wherein the logic control circuit is configured to assert a second value on the delay line enable signal to disable the DDL when the duty cycle of the DC-DC converter is greater than the setpoint of the DC-DC converter.

9. The DC-DC converter of claim 8, wherein enabling the DDL comprises providing a clock signal to the DDL, and disabling the DDL comprises not providing the clock signal to the DDL.

10. The DC-DC converter of claim 7, wherein the logic control circuit is configured to assert a first value on the fine adjust select signal to select the delayed version of the signal pulse when the duty cycle of the DC-DC converter is less than the setpoint of the DC-DC converter, and wherein the logic control circuit is configured to assert a second value on the fine adjust select signal to select the pulse width of the signal pulse when the duty cycle of the DC-DC converter is greater than the setpoint of the DC-DC converter.

11. A method for operating a direct current (DC) to DC (DC-DC) converter, the method comprising:
    determining, by the DC-DC converter, a setpoint of the DC-DC converter;
    determining, by the DC-DC converter, a first duty cycle of the DC-DC converter; and
    determining, by the DC-DC converter, that the first duty cycle is greater than the setpoint, and based thereon, generating, by the DC-DC converter, a first signal pulse having a first pulse width in accordance with an input voltage and an output voltage of the DC-DC converter, the first signal pulse corresponding to a voltage level of the output voltage of the DC-DC converter;

powering down, by the DC-DC converter, a digital delay line (DDL) used to introduce delays to the first pulse width of the first signal pulse; and outputting, by the DC-DC converter, the first signal pulse.

12. The method of claim 11, the first duty cycle of the DC-DC converter being a ratio of the output voltage of the DC-DC converter to the input voltage of the DC-DC converter.

13. The method of claim 12, the first duty cycle of the DC-DC converter being expressible as:

$$\text{duty cycle} = V_{OUT}/V_{IN},$$

where $V_{OUT}$ is the voltage level of the output voltage of the DC-DC converter, and $V_{IN}$ is a voltage level of the input voltage of the DC-DC converter.

14. The method of claim 11, the setpoint of the DC-DC converter being a ratio of the input voltage of the DC-DC converter to a maximum variance in the output voltage of the DC-DC converter.

15. The method of claim 11, further comprising:

determining, by the DC-DC converter, a second duty cycle of the DC-DC converter; and determining, by the DC-DC converter, that the second duty cycle is less than the setpoint, and based thereon, generating, by the DC-DC converter, a second signal pulse having a second pulse width in accordance with the input voltage and the output voltage of the DC-DC converter, the second signal pulse corresponding to the voltage level of the output voltage of the DC-DC converter;

providing, by the DC-DC converter, power to the DDL used to introduce delays to the second pulse width of the second signal pulse; and outputting, by the DC-DC converter, a delayed version of the second signal pulse.

16. A direct current (DC) to DC (DC-DC) converter comprising:

a comparator configured to set a pulse width of a signal pulse, the pulse width corresponding to a voltage level of an output voltage of the DC-DC converter;

a digital delay line (DDL) operatively coupled to the comparator, the DDL configured to linearly introduce delays to the signal pulse, thereby increasing the pulse width of the signal pulse;

a multiplexer operatively coupled to the DDL, the multiplexer configured to selectively output a delayed version of the signal pulse;

one or more processors; and a non-transitory memory storage comprising instructions that, when executed by the one or more processors, cause the DC-DC converter to:

determine a setpoint of the DC-DC converter;

determine a first duty cycle of the DC-DC converter; and determine that the first duty cycle is greater than the setpoint, and based thereon, generate a first signal pulse having a first pulse width in accordance with an input voltage and the output voltage of the DC-DC converter, the first signal pulse corresponding to the voltage level of the output voltage of the DC-DC converter;

power down the DDL used to introduce delays to the first pulse width of the first signal pulse corresponding to the voltage level of the output voltage of the DC-DC converter; and output the first signal pulse.

17. The DC-DC converter of claim 16, wherein the first duty cycle of the DC-DC converter is a ratio of the output voltage of the DC-DC converter to the input voltage of the DC-DC converter.

18. The DC-DC converter of claim 17, the first duty cycle of the DC-DC converter being expressible as:

$$\text{duty cycle} = V_{OUT}/V_{IN},$$

where $V_{OUT}$ is the voltage level of the output voltage of the DC-DC converter, and $V_{IN}$ is a voltage level of the input voltage of the DC-DC converter.

19. The DC-DC converter of claim 16, wherein the setpoint of the DC-DC converter is a ratio of the input voltage of the DC-DC converter to a maximum variance in the output voltage of the DC-DC converter.

20. The DC-DC converter of claim 16, the instructions cause the DC-DC converter to determine a second duty cycle of the DC-DC converter; and determine that the second duty cycle is less than the setpoint, and based thereon, generate a second signal pulse having a second pulse width in accordance with the input voltage and the output voltage of the DC-DC converter, the second signal pulse corresponding to the voltage level of the output voltage of the DC-DC converter; provide power to the DDL used to introduce delays to the second pulse width of the second signal pulse; and output a delayed version of the second signal pulse.

* * * * *